United States Patent [19]

Luft

[11] Patent Number: 4,712,220
[45] Date of Patent: Dec. 8, 1987

[54] MULTIPLE LASER ARRANGEMENT

[75] Inventor: Johann Luft, Munich, Fed. Rep. of Germany

[73] Assignee: Siemens Aktiengesellschaft, Berlin and Munich, Fed. Rep. of Germany

[21] Appl. No.: 879,860

[22] Filed: Jun. 27, 1986

[30] Foreign Application Priority Data

Sep. 30, 1985 [DE] Fed. Rep. of Germany ....... 3534912

[51] Int. Cl.⁴ .............................................. H01S 3/19
[52] U.S. Cl. ....................................... 372/50; 372/46; 372/48; 372/18
[58] Field of Search ........................ 372/50, 48, 46, 18

[56] References Cited

U.S. PATENT DOCUMENTS

| 3,531,735 | 9/1970 | Collins et al. | 331/94.5 |
| 3,701,044 | 10/1972 | Paoli et al. | 331/94.5 |
| 4,503,541 | 3/1985 | Weller et al. | 372/50 |
| 4,594,719 | 6/1986 | Ackley | 372/50 |

FOREIGN PATENT DOCUMENTS 0010949 5/1980 European Pat. Off. .
0064339 11/1982 European Pat. Off. .

OTHER PUBLICATIONS

Electronics Letters, vol. 21, No. 14, Jul. 4, 1985, pp. 603 to 605.
Electronics, Jul. 22, 1985, p. 25.
Applied Physics Letters, vol. 45, No. 12, 12/15/84, pp. 1257 to 1259.

Primary Examiner—Léon Scott, Jr.
Attorney, Agent, or Firm—John Francis Moran

[57] ABSTRACT

In a multiple laser arrangement (1) with a plurality of phase-coupled laser diodes with lateral extremities (2, 3) of the multiple laser arrangement (1) including decoupling means for improving the output radiation of the laser arrangement. An absorbent material (4) or a synthetic material is provided at the lateral extremities (2, 3) for the purpose of reducing undesired transverse modes or ring modes.

28 Claims, 2 Drawing Figures

MULTIPLE LASER ARRANGEMENT

BACKGROUND OF THE INVENTION

This invention relates to a multiple laser arrangement with phase-coupled laser diodes, and, it relates, more particularly, to a multiple laser arrangement wherein means for suppressing undesired transverse or ring modes is disposed at the lateral edges or extremities of the laser arrangement.

Many applications make it desirable to use phase-coupled laser diode arrays having a continuous wave power output in the watt region. This typically requires laser arrays with a plurality of single stripes.

A multiple laser arrangement enables the coupling of, for example, radiated power into a monomode or single mode optical fiber wherein the radiated power is on the order of approximately five to ten times greater than that in the case of a single laser. When coupling the radiated power into a monomode optical fiber, for example, a laterally coupled laser arrangement must have suitable radiation characteristics in the fundamental mode with a single lobe. Laser arrangements with a metallized standing waveguide structure, also referred to as MCRW lasers, permit lateral coupling of such lasers.

Phase-coupled laser diode arrays oscillate as the number of laterally coupled single stripes increases or as the ratio of the laser array width to laser resonator length increases above a value of 0.5 (when the laser reflector is asymmetrically coated with one-quarter wavelength layers and one-half wavelength layers for the purpose of unilaterally increasing the differential efficiency), which is preferred when operating low-loss internal oscillation modes. In such an arrangement, the decoupling of the laser radiation from the multiple laser arrangement (laser array) can, to a large extent, be prevented.

This effect of the widespread failure to prevent the decoupling of laser radiation has hitherto restricted the size and, at the same time, the maximum power output of conventional phase-coupled laser arrays.

The assembly and effect of a multiple laser arrangement (laser array) are described in *Electronics*, July 22, 1985, page 25. In this article, a multiple laser arrangement is described with forty single stripes wherein each individual stripe measures 400 $\mu$m long and 3 $\mu$m wide. Further, a gallium aluminum arsenide multiple layer is applied to a gallium arsenide substrate. The entire multiple laser arrangement is on a chip measuring 0.4 to 0.5 mm wide and 100 $\mu$m thick. The typical center-to-center distance between stripes is 10 $\mu$m. This multiple laser arrangement emits power into two lobes which are arranged to form an angle between them within seven degrees. Each lobe has a width of less than 2°. Well-defined divergence of the radiated power results from phase-coupled operation of the multiple laser arrangement. The multiple laser arrangement can be produced either in a double hereto structure or in a MWQ (multiple quantum well) structure or even in another type of structure. The substrate layers can be produced by means of a metal-organic vapor-phase epitaxy (MOVPE) or by means of a liquid phase epitaxy or by means of another suitable technique.

With the conventional multiple laser arrangements, the partial suppression of internal oscillation mode is made possible by the fact that V-shaped etched grooves are produced as a lateral laser array limitation, or the fact that ring mode feedback is reduced by damage to the lateral chip surface unavoidably produced by sawing or other mechanical processes.

However, laser arrays with a one-quarter wavelength coating (antireflection layer applied to a laser reflector side so as to increase the differential efficiency) already show that, with a ratio of laser array width to laser resonator length of 0.45, for all practical purposes radiation decoupling no longer exists, even when the lateral edges of the laser array chips have been beveled by means of V-shaped etching.

SUMMARY OF THE INVENTION

It is an object of the present invention to present a multiple laser arrangement of the foregoing mentioned type in which the decoupling of radiation is improved.

The present invention takes the form of a multiple laser arrangement wherein the lateral extremities includes means for absorbing undesired transverse modes or ring modes which would otherwise reduce the efficiency and output radiant power of the arrangement.

The lateral extremities of the laser array chip may have been produced on the laser chip by various methods—chemical, mechanical or other. It is important with respect to the present invention that the suppression of undesirable transverse or ring modes is improved by decoupling said modes by applying additional absorbent material to at least one of the extremities of the multiple laser arrangement or by applyiing synthetic material to at least one of the extremities of the multiple laser arrangement, and that the undesirable modes will most likely be decoupled from the multiple laser arrangements, at least on one extremity of the arrangement, rather than recoupled back into the multiple laser arrangement.

BRIEF DESCRIPTION OF THE DRAWING

Features of the invention and additional objects of the invention will be more readily appreciated and better understood by reference to the following detailed description of various illustrative embodiments which should be considered in conjunction with the drawing.

DETAILED DESCRIPTION

Figure 1:
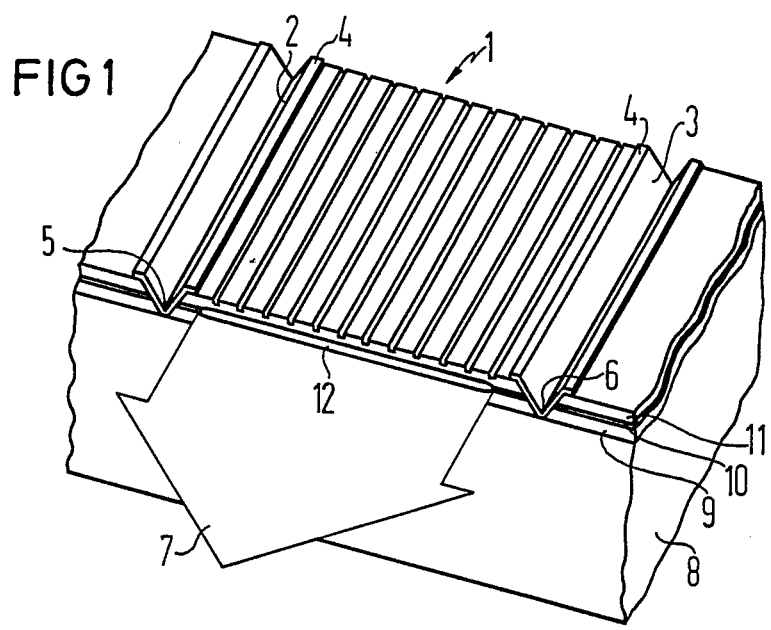
FIG. 1 serves to demonstrate the principles of the present invention in an illustrative multiple laser arrangement.

FIG. 1 depicts a multiple laser arrangement 1 as an illustrative embodiment of the invention 1. At the lateral chip surfaces 2, 3 of the laser array 1, which are produced by beveled etching or by sawing or scoring and breaking, a material 4 is applied which absorbs the radiation of the undesired transverse or ring modes. To provide improved coupling of the undesired radiation into the absorbing material 4, it is advantageous for the index of refraction of the absorbent material 4 to match the index of refraction which is provided by the laser array material at the lateral extremity of the laser array 1.

In the event that laser arrays are made of base material comprising gallium arsenide, sputtered or evaporated silicon and/or germanium layers will suitably serve as the absorbent material 4. In the situation wherein the laser diodes are made of indium gallium arsenide phosphide or indium gallium aluminum arsenide applied to a base material made of indium phosphide, the material of the absorbent layer 4 may, for example be indium arsenide or of another semiconductor layer with an energy band gap which is smaller than that which the material of the laser array 1 exhibits at the lateral extremity. Basically any type of material may be used as an absorbent material 4 which enables decoupling and absorption of undesired modes of the laser array 1.

Rather than coating with an absorbent material 4, it is also possible to apply synthetic material to at least one lateral extremity of the laser array 1. An etched, lateral V-shaped groove 5, 6 can be filled with synthetic material. Depending on the index of refraction of the applied synthetic material, part of the ring mode radiation is decoupled from the laser array crystal and essentially not reflected back into the laser array crystal, so that the actual desired oscillation mode of the laser array 1 is thus improved.

The laser array 1 in FIG. 1 is provided with 12 single stripes. The laser array 1 comprises a substrate 8 with subsequent layers 9, 10, 11. The laser array 1 has a laser-active range 12 from which the beam 7 is emitted.

The respective position of the individual laser diode stripes in the semiconductor body of the laser array 1 may be determined by various means, for example, by parallel running oxide stripes (oxide stripe lasers), parallel running waveguide stripes, parallel running high-impedance stripe zones, etc.

Between the adjacent laser-active regions in a semiconductor body an optical coupling can occur, with the result that a correlation occurs between the laser radiation generated in such laser-active regions. This is caused by an overlapping of the tails of the respective radia of action of the relevant regions, and it also extends beyond the regions of the semiconductor body of the laser array 1 in which the conditions for the occurrence of a stimulated radiation or the existence of an inversion, i.e., an inversion of the natural concentration density of energy levels, are not suitable for various reasons, for example, because in these regions the threshold current value for the stimulated radiation is not attained.

The absorbent material 4 or synthetic material applied to the lateral extremity of the laser array 1 must not coat the entire lateral extremity of the laser array 1. An advantageous effect is already obtained when only portions of the extremity of the laser array 1 are coated with absorbent material 4 or synthetic material. The coating applied to the extremity may also take the material form of a mixture of synthetic and absorbent material.

Figure 2:
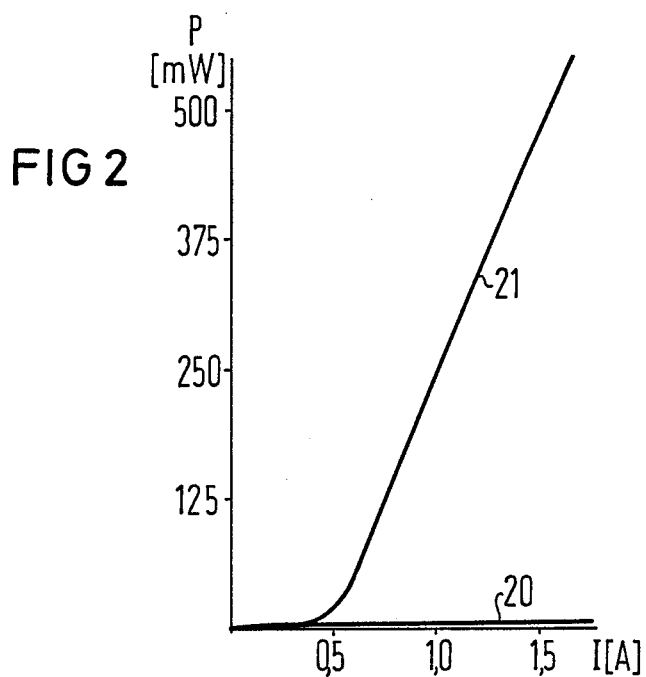
FIG. 2 illustrates a typical characteristic achieved by employing the inventive principles in a multiple laser arrangement.

FIG. 2 provides a typical output characteristic for the present invention. FIG. 2 illustrates the radiation output power (P) as a function of current. This particular characteristic curve is for a gallium aluminum arsenide (GaAlAs) 12-stripe laser array 1 with a V-shaped groove etching for the lateral extremity of the laser array chips. The laser reflectors of the 12-stripe laser array are asymmetrically coated with one-quarter wavelength and one-half wavelength layers. The resonator length of the 12-stripe laser array 1 measures 150 $\mu$m, and the width of the laser array is approximately 120 $\mu$m. The 12-stripe laser array without coating in the V-shaped groove, does not exhibit radiation decoupling (as demonstrated by horizontal line 20), while the 12-stripe laser array with a V-shaped groove having a sputtered germanium/silicon layer, lasers at a differential efficiency of 0.5 W/A (line 21). Additionally, the 12-stripe laser arrays are provided each with 12 phase-coupled single stripes. The characteristics 20, 21 were attained by a pulse measurement with a 1 $\mu$s duration and a 10 kH pulse frequency.

There has thus been shown and described a novel multiple integrated laser diode arrangement which fulfills all the objects and advantages sought therefor. Many changes, modifications, variations and other uses and applications of the subject invention will, however, become apparent to those skilled in the art after considering this specification and the accompanying drawing which disclose the preferred embodiment thereof. All such changes, modifications, variations and other uses and applications which do not depart from the spirit and scope of the invention are deemed to be covered by the invention which is limited only by the claims which follow.

I claim:

1. A multiple laser arrangement including a plurality of phase-coupled laser diodes with lateral extremities of the multiple laser arrangement characterized by a material for absorbing undesired transverse modes or ring modes is located at the lateral extremities of the multiple laser arrangement.

2. A multiple laser arrangement according to claim 1, characterized by the index of refraction of the absorbent material is matched with the index of refraction that is provided at the lateral extremities with the multiple laser arrangement for improving decoupling of undesired transverse modes and ring modes.

3. A multiple laser arrangement according to claim 2, wherein the absorbent material includes germamium.

4. A multiple laser arrangement according to claim 2, wherein the absorbent material contains silicon.

5. A multiple laser arrangement according to claim 2, wherein the absorbent material contains indium arsenide (InAs).

6. A multiple laser arrangement according to claim 2, wherein the absorbent material contains a material whose energy band gap is smaller than that of the material of the lateral extremity of the multiple laser arrangement.

7. A multiple laser arrangement according to claim 1, wherein the absorbent material includes a semiconductor material.

8. A multiple laser arrangement according to claim 7, wherein the absorbent material includes germamium.

9. A multiple laser arrangement according to claim 7, wherein the absorbent material contains silicon.

10. A multiple laser arrangement according to claim 7, wherein the absorbent material contains indium arsenide (InAs).

11. A multiple laser arrangement according to claim 7, wherein the absorbent material is evaporated.

12. A multiple laser arrangement according to claim 7, wherein the absorbent material is sputtered.

13. A multiple laser arrangement according to claim 1, wherein the absorbent material includes germamium.

14. A multiple laser arrangement according to claim 1, wherein the absorbent material contains silicon.

15. A multiple laser arrangement according to claim 1, wherein the absorbent material contains indium arsenide (InAs).

16. A multiple laser arrangement according to claim 1, wherein the absorbent material contains a material whose energy band gap is smaller than that of the material of the lateral extremity of the multiple laser arrangement.

17. A multiple laser arrangement according to claim 16, wherein the absorbent material is evaporated.

18. A multiple laser arrangement according to claim 16, wherein the absorbent material is sputtered.

19. A multiple laser arrangement according to claim 1, wherein the absorbent material is evaporated.

20. A multiple laser arrangement according to claim 1, wherein the absorbent material is sputtered.

21. A multiple laser arrangement including a plurality of phase-coupled laser diodes with lateral extremities of the multiple laser arrangement characterized by a synthetic material is applied to the lateral extremities of the multiple laser arrangement for absorbing undesired transverse modes or ring modes.

22. A multiple laser arrangement according to claim 21, wherein the absorbent material includes a semiconductor material.

23. A multiple laser arrangement according to claim 22, wherein the absorbent material contains indium arsenide (InAs).

24. A multiple laser arrangement according to claim 21, wherein the absorbent material includes germamium.

25. A multiple laser arrangement according to claim 21, wherein the absorbent material contains silicon.

26. A multiple laser arrangement according to claim 21, wherein the absorbent material contains indium arsenide (InAs).

27. A multiple laser arrangement according to claim 21, wherein the absorbent material contains a material whose energy band gap is smaller than that of the material of the lateral extremity of the multiple laser arrangement.

28. A multiple laser arrangement according to claim 21, wherein the synthetic material has an index of refraction matched to that of the material of the lateral extremities of the multiple laser arrangement for the purpose of decoupling the undesired radiation modes.

* * * * *